(12) United States Patent
Gaidis et al.

(10) Patent No.: US 7,381,343 B2
(45) Date of Patent: Jun. 3, 2008

(54) HARD MASK STRUCTURE FOR PATTERNING OF MATERIALS

(75) Inventors: Michael C. Gaidis, Wappingers Falls, NY (US); Sivananda K. Kanakasabapathy, Hopewell Junction, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 11/177,008

(22) Filed: Jul. 8, 2005

(65) Prior Publication Data
US 2007/0020934 A1   Jan. 25, 2007

(51) Int. Cl.
*B44C 1/22* (2006.01)
*H01L 21/302* (2006.01)

(52) U.S. Cl. ............... 216/47; 216/22; 216/41; 216/58; 438/689; 438/706; 438/712

(58) Field of Classification Search .......... 216/22, 216/41, 58; 438/689, 706, 712
See application file for complete search history.

(56) References Cited

U.S. PATENT DOCUMENTS

| | | | |
|---|---|---|---|
| 6,323,093 B1 * | 11/2001 | Xiang et al. | 438/299 |
| 6,613,681 B1 | 9/2003 | Hillyer et al. | |
| 6,696,222 B2 * | 2/2004 | Hsue et al. | 430/313 |
| 6,793,830 B2 * | 9/2004 | Mattes et al. | 216/2 |
| 6,965,138 B2 * | 11/2005 | Nakajima et al. | 257/295 |
| 7,291,283 B2 * | 11/2007 | Uesugi et al. | 216/41 |
| 2004/0046204 A1 | 3/2004 | Choi et al. | 257/315 |
| 2004/0241974 A1 | 12/2004 | Yun et al. | 438/597 |
| 2005/0067643 A1 * | 3/2005 | Zhuang et al. | 257/295 |
| 2006/0124587 A1 * | 6/2006 | Lee | 216/47 |
| 2006/0128159 A1 * | 6/2006 | Hillyer et al. | 438/706 |

FOREIGN PATENT DOCUMENTS

WO   PCTUS0544263   12/2007

* cited by examiner

*Primary Examiner*—Shamim Ahmed
(74) *Attorney, Agent, or Firm*—Ido Tuchman; Ryan, Mason & Lewis, LLP

(57) ABSTRACT

Techniques for magnetic device fabrication are provided. In one aspect, a method of patterning at least one, e.g., non-volatile, material comprises the following steps. A hard mask structure is formed on at least one surface of the material to be patterned. The hard mask structure is configured to have a base, proximate to the material, and a top opposite the base. The base has one or more lateral dimensions that are greater than one or more lateral dimensions of the top of the hard mask structure, such that at least one portion of the base extends out laterally a substantial distance beyond the top. The top of the hard mask structure is at a greater vertical distance from the material being etched than the base. The material is etched.

24 Claims, 8 Drawing Sheets

CONTINUED TO FIG. 6B

HARD MASK STRUCTURE FOR PATTERNING OF MATERIALS

FIELD OF THE INVENTION

The present invention relates to patterning of materials and, more particularly, to improved hard mask structures for patterning of materials.

BACKGROUND OF THE INVENTION

Devices, such as magnetic memory devices, may be formed using standard patterning techniques. Magnetic memory devices use magnetic memory cells to store information. Information is stored in such magnetic memory devices as the orientation of the magnetization of a storage layer in the magnetic memory cell as compared to the orientation of the magnetization of a reference layer in the memory cell. The magnetization of the storage layer may be oriented parallel or anti-parallel to the reference layer, representing either a logic "0" or a "1." One type of memory cell, a magnetic tunnel junction (MTJ), comprises a storage layer and a reference layer separated by a tunnel barrier.

Patterning of the magnetic memory cells can be done with reactive ion etching, e.g., in a manner similar to that used to pattern transistors in complementary metal oxide semiconductor (CMOS) technology. Alternatively, patterning can be done with ion beam etching, e.g., in a manner similar to that used to pattern read heads for magnetic disk drives. During etching to pattern the magnetic memory cells, however, nonvolatile materials that have been removed from the wafer surfaces may become re-deposited on portions of the cell, having deleterious effects. The re-deposited materials can result in a poorly-defined cell shape, e.g., by terminating the edges with an ill-defined material. Further, in the case of an MTJ, for example, the re-deposited material can cause shorting across the tunnel barrier. Thus, use of conventional etching techniques can negatively affect the properties of the cell. This problem may be further worsened by the use of certain materials that are particularly difficult to etch, as they do not easily form volatile compounds when interacting with etch gasses at normal processing temperatures.

Therefore, etching techniques that minimize or eliminate the effects of re-deposited materials would be desirable.

SUMMARY OF THE INVENTION

Techniques for patterning of materials using a hard mask structure are provided, in accordance with an illustrative embodiment of the present invention. In one aspect of the invention, a method of patterning at least one material comprises the following steps. A hard mask structure is formed on at least one surface of the material to be patterned. The hard mask structure is configured to have a base, proximate to the material, and a top opposite the base. The base has one or more lateral dimensions that are greater than one or more lateral dimensions of the top of the hard mask structure, such that at least one portion of the base extends out laterally a substantial distance beyond the top. The top of the hard mask structure is at a greater vertical distance from the material being etched than the base. For example, each at least one portion of the base extending out laterally beyond the top, when viewed in lateral cross section, has a longest lateral dimension that is between about 20 percent and about 40 percent, e.g., between about 30 percent and about 40 percent, of the longest lateral dimension of the base. The material is etched.

A more complete understanding of the present invention, as well as further features and advantages of the present invention, will be obtained by reference to the following detailed description and drawings.

DETAILED DESCRIPTION OF PREFERRED EMBODIMENTS

Prior to describing the inventive aspects of the present invention, FIGS. 1 and 2, directed to conventional etching techniques, will be described. It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual integrated circuit device.

Figure 1:
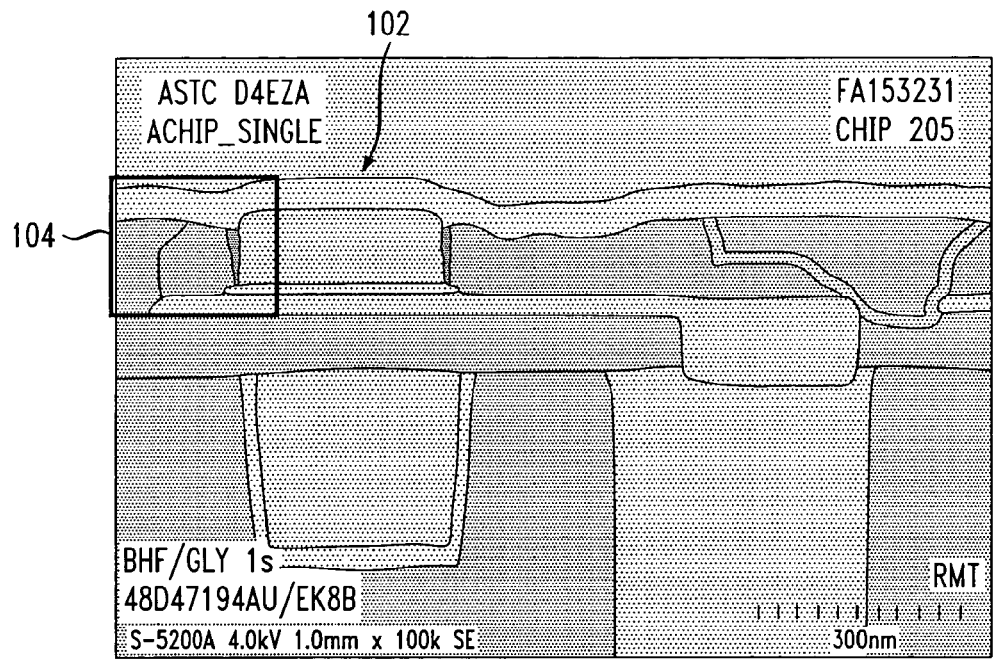
FIG. 1 is a cross-sectional image of a magnetic device having been formed using conventional etching techniques.

FIG. 1 is a cross-sectional image of magnetic device 102 having been formed using conventional etching techniques. Portion 104 of magnetic device 102 is shown amplified in FIG. 2, described below. Magnetic device 102 comprises a magnetic tunnel junction (MTJ).

Figure 2:
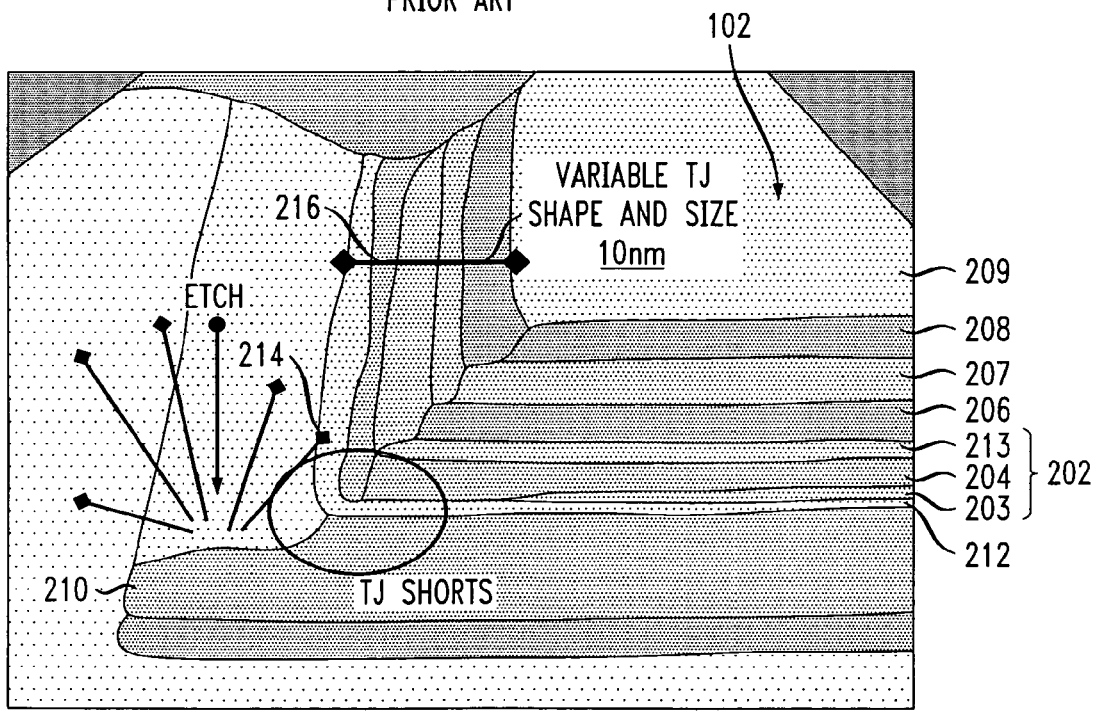
FIG. 2 is an image of a portion of a magnetic device being formed using conventional etching techniques.

FIG. 2 is an image of portion 104 of magnetic device 102 (of FIG. 1). As shown in FIG. 2, magnetic device 102 comprises storage, e.g., soft, layer 202, which comprises magnetic layers 203 and 213 separated by coupling layer 204. Magnetic device 102 also comprises reference layer 210 separated from storage layer 202 by tunnel barrier 212. Cap/hard mask/etch stop layers 206, 207, 208, and 209 are present on top of storage layer 202.

During etching of magnetic device 102, material dislodged by the etching may become re-distributed, as indicated, e.g., by arrows 214. The re-distributed material can undesirably re-deposit on portions of magnetic device 102, which is typically the case during etching of nonvolatile materials.

Specifically, the re-distributed materials may re-deposit on portions of magnetic device 102 that have already been etched. For example, the re-distributed material from etching of reference layer 210 may be re-deposited on portions of storage layer 202 and tunnel barrier 212, which can unfavorably result in magnetic device 102 having a variable shape and/or size, e.g., as indicated by arrow 216. This re-deposition of materials on the, sidewalls of the device during etching is referred to herein as "sidewall re-deposition."

The re-distributed materials can also become re-deposited so as to form a continuous electrical contact from storage layer 202 to reference layer 210, shorting out tunnel barrier 212. As such, the magnetic and electronic behavior of the device formed may be adversely affected.

While the present description provides, as an exemplary model, for the formation of magnetic devices, such as magnetic random access memory (MRAM) devices, it is to be understood that the present techniques are broadly applicable to the patterning of materials, including nonvolatile materials not readily etched by standard reactive ion etching (RIE) techniques. Other suitable applications for the present techniques include, but are not limited to, etching of capacitors made with, e.g., nonvolatile platinum (Pt) or iridium (Ir)-based electrodes, etching of ferroelectric materials (such as lead zirconium titanate (PLZT)), for ferroelectric random access memory (FRAM), etching of phase change materials, e.g., chalcogenides for phase change memory (PCM), and etching of metal gate materials for transistor applications such as complementary metal oxide semiconductor (CMOS), with materials including, but not limited to, molybdenum (Mo), Ir, rhodium (Rh), rhenium (Re), ruthenium (Ru), nickel (Ni), tungsten (W) and tantalum (Ta).

Figure 3:
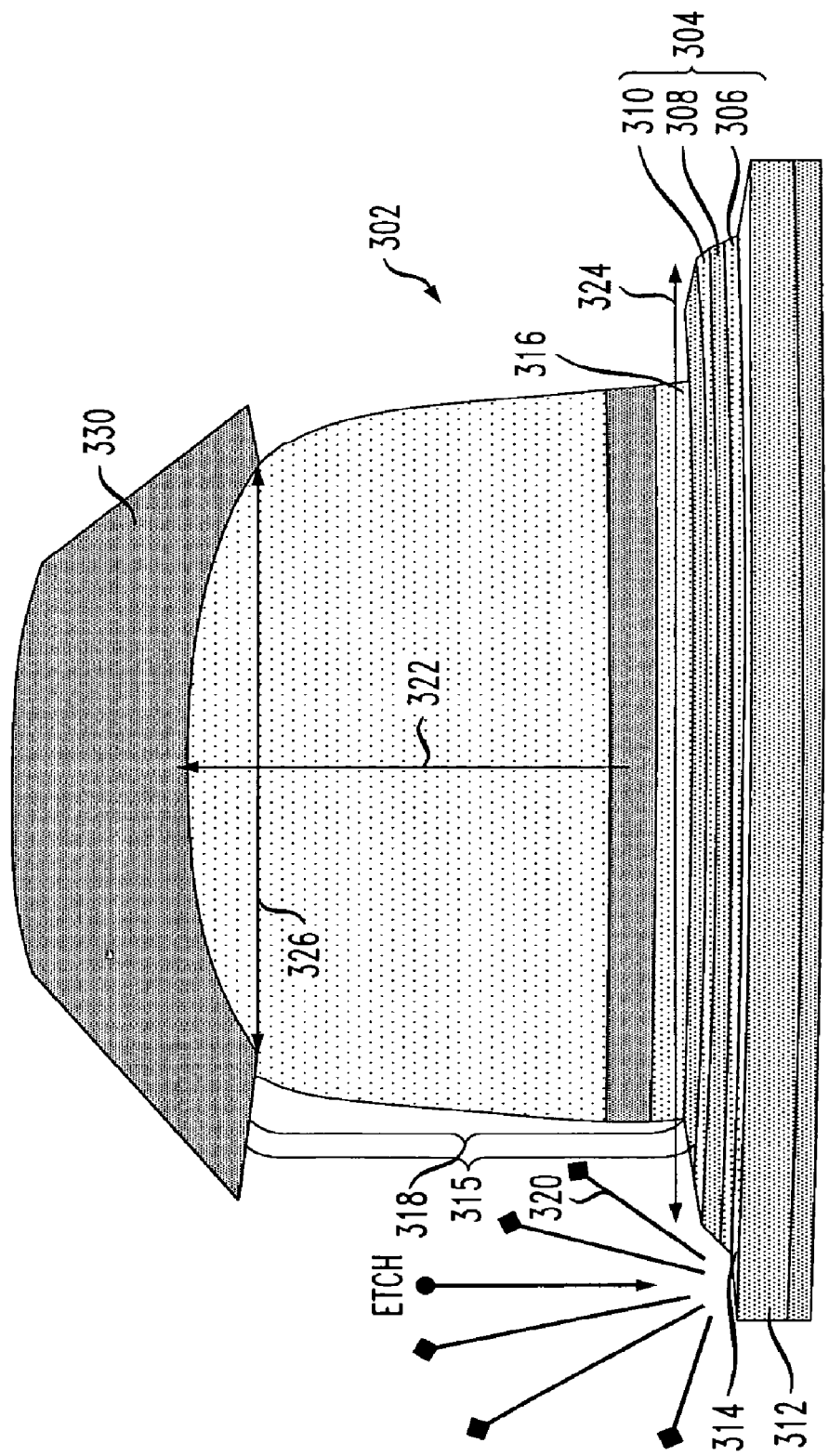
FIG. 3 is a lateral cross-sectional image of a magnetic device being formed using the present techniques according to an embodiment of the present invention.

FIG. 3 is a lateral cross-sectional image of magnetic device 302 being formed using the present techniques. According to one exemplary embodiment, magnetic device 302 comprises an MTJ. Magnetic device 302 comprises storage, e.g., soft, layer 304, which itself comprises magnetic layers 306 and 310 in an anti-parallel configuration, separated by coupling layer 308. Magnetic device 302 also comprises reference layer 312 separated from storage layer 304 by barrier layer 314. Reference layer 312 may comprise a single layer, or alternatively, multiple layers.

During formation of magnetic device 302, hard mask structure 315, comprising thin hard mask layer 316 and thick hard mask layer 318, is employed to prevent, at least in part, the undesirable effects of re-deposited nonvolatile material which becomes re-distributed during etching, e.g., as indicated by arrow 320. The term "nonvolatile material," as used herein, indicates that the material does not readily form volatile compounds through reaction with the etch gasses, as would be the case for conventional RIE at temperatures less than about 200° C. Such nonvolatile materials will adhere to the exposed surfaces of the wafer and the etch chamber, rather than being carried away as gas-phase by-products of the etch. The term "hard mask," as used herein, generally refers to any non-photoresist material.

Specifically, hard mask structure 315 is configured to have a base proximate to the material being etched and a top opposite the base. The base has one or more lateral dimensions that are greater than one or more lateral dimensions of a top of hard mask structure 315, such that at least one portion of the base extends out laterally a substantial distance beyond the top. According to one exemplary embodiment, when viewed in lateral cross-section, each portion of the base extending out laterally beyond the top has a longest lateral dimension that is between about 20 percent and about 40 percent of the longest lateral dimension of the base. For example, each portion of the base extending out laterally beyond the top has a longest lateral dimension that is between about 30 percent and about 40 percent of the longest lateral dimension of the base.

The top of hard mask structure 315 is at a greater vertical distance from the material being etched than the base. For example, hard mask structure 315 may comprise a base, e.g., comprising thin hard mask layer 316, and a top, e.g., comprising thick hard mask layer 318, so as to form a "top hat" configuration.

Further, hard mask structure 315 may be a circular, or substantially circular (e.g., elliptical) structure, when viewed as a lateral cross-section, wherein the base has a diameter that is greater than a diameter of the top of hard mask structure 315, distal to the material being etched. See, for example, FIGS. 7A-D which show top-down and tilted-angle side views of elliptical structures similar to that seen in cross-section in FIG. 3. Specifically, according to one exemplary embodiment, hard mask structure 315 is circular, and has a diameter 324 at its base that is greater than diameter 326 at its top.

However, a circular, or substantially circular hard mask structure is merely an exemplary configuration. Other suitable hard mask structure configurations, for example, include, but are not limited to, rectangular or linear configurations. Further, each portion of the base extending laterally beyond the top has a first slope and at least one sidewall of the top has a second slope, the first slope being different from the second slope. Specifically, taking the interface of the base and the top as an origin, the slope of the top, which may include a slope of infinity (or, equivalently 90 degrees), is substantially greater than the slope of the base, which may include a slope of zero or, in some exemplary embodiments, a negative slope, such that an outermost laterally extending portion of the base is thicker than a portion of the base at the origin.

Figure 5:
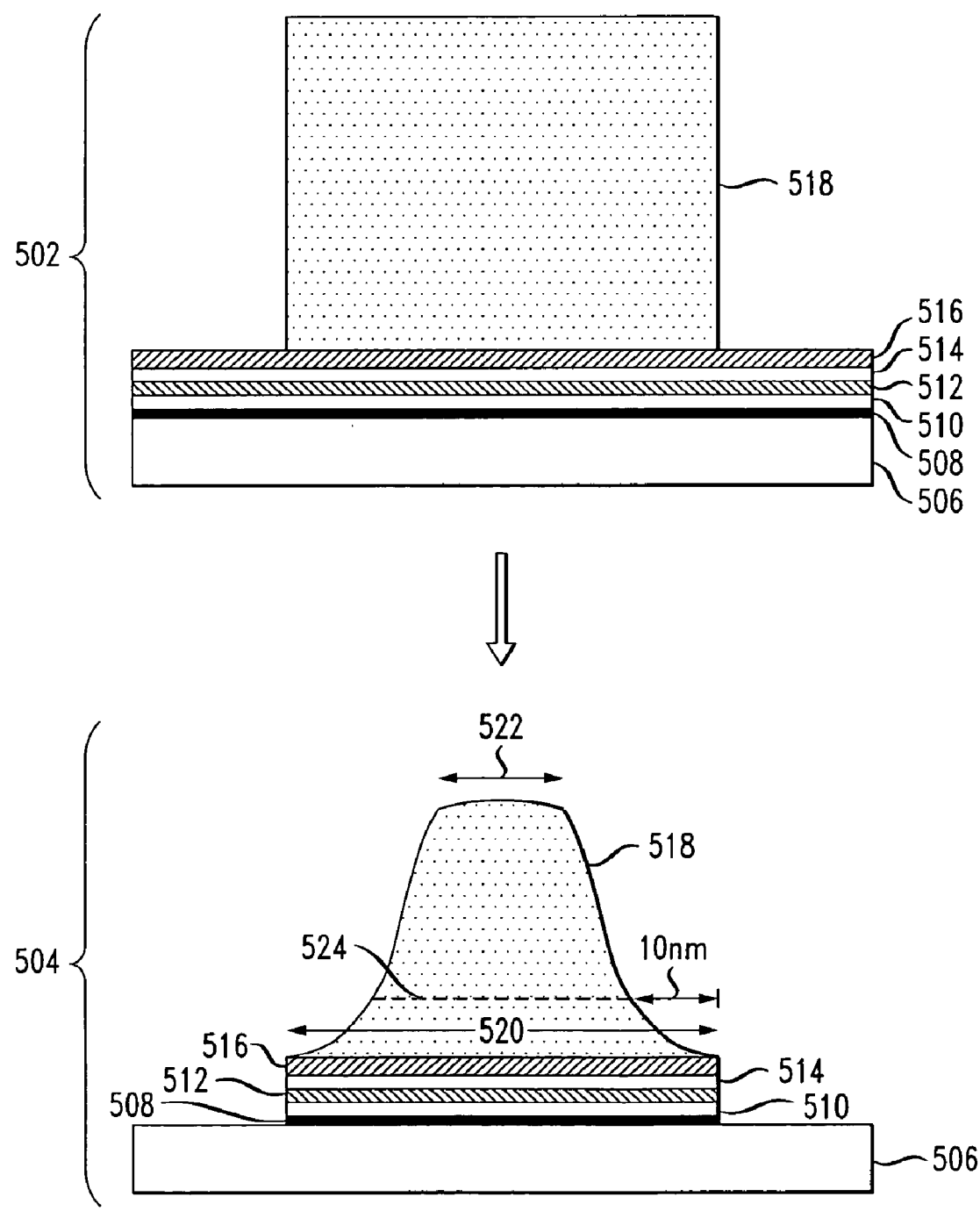
FIG. 5 is a diagram illustrating another exemplary methodology for forming a magnetic device according to an embodiment of the present invention.

Further, as shown in FIG. 3, the progression of the diameter being larger at the base to smaller at the top may be in a step-like fashion (e.g., an abrupt change in diameter from thin hard mask layer 316 to thick hard mask layer 318). However, as is shown in FIG. 5, and described below, the hard mask structure may have a tapered configuration.

As a result, hard mask structure 315 is thickest at its center, e.g., center thickness 322. As will be described in detail below, this configuration is desirable for its utility in connecting magnetic device 302 to associated wiring levels above the device.

Having a hard mask structure with a diameter at its base that is greater than a diameter at its top has several notable advantages. For example, with such a hard mask structure, the shadowing of incoming etchant is minimized, which increases the sputter yield of the sidewall re-deposition. As such, the sidewalls are kept clean during etching of unmasked regions. Also, the present hard mask configuration minimizes the surface area of the hard mask that can act as a collector of nonvolatile residues just above the sensitive exposed edges of the soft layer and tunnel barrier. Therefore, less material will be present to be sputtered downward, and e.g., shunt the tunnel barrier. Referring to FIG. 3, sidewall re-deposits on thick hard mask 318 may again (during the same etch process that created the re-deposited material) be displaced downwards (forward-sputtered) to land on top of thin hard mask 316. According to the present techniques, this material is, however, kept at a substantial distance from the sensitive edges of the active layers, e.g., storage layer 304, and barrier layer 314. The reduced hard mask thickness (e.g., from layer 316 only) near the sensitive edge results in less available material to be forward-sputtered, and thus less risk of shunting the device, e.g., shorting barrier layer 314, or altering its behavior.

As mentioned above, according to one exemplary embodiment, the present hard mask structure is used in forming an MTJ wherein portions of the hard mask structure remain, post-etching, as an integral part of the MTJ. According to this exemplary embodiment, the hard mask structure is electrically conductive. As such, the present hard mask structure is advantageous as it is thickest at its center and provides for an easy connection to wiring levels associated with the device. For example, in FIG. 3, hard mask structure 315 is thickest at its center, e.g., thickness 322, which provides for a self-aligned connection to wiring layer 330 above the device, see below description.

The use of a hard mask structure comprising a thick/thin hard mask bilayer during the formation of a magnetic tunnel junction is shown schematically, for example, in FIG. 4, and described below.

Figure 4:
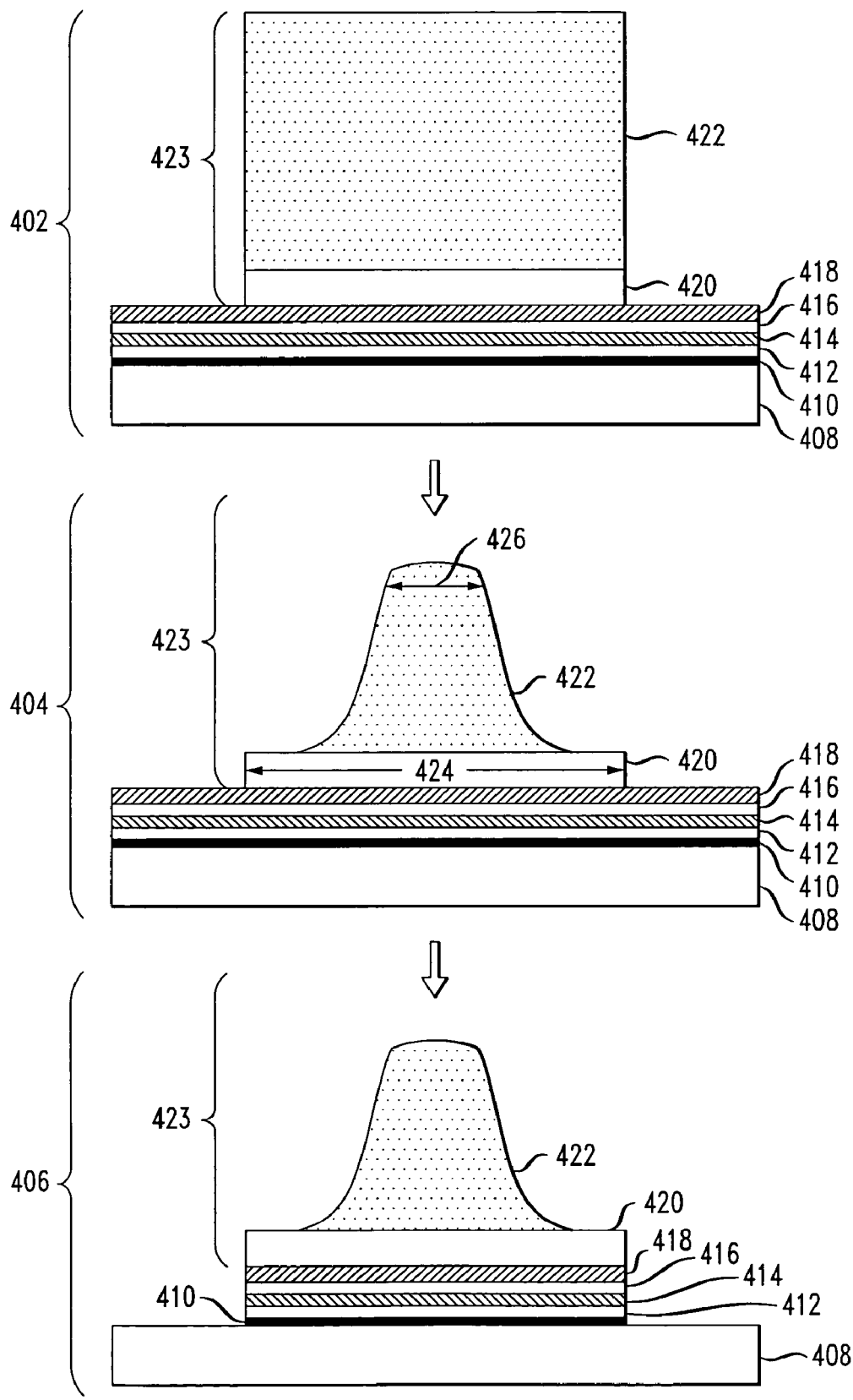
FIG. 4 is a diagram illustrating an exemplary methodology for forming a magnetic device according to an embodiment of the present invention.

FIG. 4 is a diagram illustrating an exemplary methodology for forming a magnetic device. According to one exemplary embodiment, the magnetic device formed comprises an MTJ. In step 402, the layers used to form the magnetic device are provided. Specifically, magnetic layer 408 will serve as a reference layer for the magnetic device. Suitable materials for forming magnetic layer 408 include, but are not limited to, one or more of iridium-manganese (IrMn), platinum-manganese (PtMn), cobalt-iron (CoFe), Ru, cobalt-iron-boron (CoFeB), nickel-iron (NiFe), chromium-molybdenum (CrMo), Ta, and tantalum nitride (TaN). Magnetic layer 408 may comprise a single layer, or alternatively, multiple layers.

Barrier layer 410, deposited on a top side of magnetic layer 408, will serve as a tunnel barrier for the magnetic device. Suitable materials for forming barrier layer 410 include, but are not limited to one or more of aluminum oxide ($Al_2O_3$), magnesium oxide (MgO), boron nitride (BN), silicon oxide (e.g., $SiO_2$), and nonstoichiometric variants thereof.

Magnetic layer 412, deposited on a side of barrier layer 410 opposite magnetic layer 408, will serve as a bottom storage layer, e.g., of a multi-layer storage layer configuration, for the magnetic device. Suitable materials for forming magnetic layer 412 include, but are not limited to one or more of NiFe, CoFe, CoFeB, nickel-cobalt-iron (NiCoFe) and multi-layers comprising one or more of the foregoing. Further, magnetic layer 412 may have a thickness of up to about ten nm, for example, from about two nm to about ten nm. According to an exemplary embodiment, magnetic layer 412 comprises NiFe and is about five nm thick.

Coupling layer 414, deposited on a side of magnetic layer 412 opposite barrier layer 410, will serve as a coupling layer for magnetic layer 412 and magnetic layer 416 (described below), e.g., for a multi-layer storage layer configuration. Suitable materials for forming coupling layer 414 include, but are not limited to, one or more of Ru, CrMo and TaN. Further, coupling layer 414 may have a thickness of up to about ten nm, for example, from about 0.5 nm to about ten nm. According to an exemplary embodiment, coupling layer 414 comprises Ru and is about five nm thick.

Magnetic layer 416, deposited on a side of coupling layer 414 opposite magnetic layer 412, will serve as a top storage layer, e.g., of a multi-layer storage layer configuration, for the magnetic device. Suitable materials for forming magnetic layer 416 include, but are not limited to, one or more of NiFe, CoFe, CoFeB, NiCoFe and multi-layers comprising one or more of the foregoing. Further, magnetic layer 416 may have a thickness of up to about ten nm, for example, from about two nm to about ten nm. According to an exemplary embodiment, magnetic layer 416 comprises NiFe and is about five nm thick.

Cap/etch stop layer 418 is deposited on a side of magnetic layer 416 opposite coupling layer 414. This layer is optional. For example, depending on the etch chemistries and/or materials used, magnetic layer 416 may act as an etch stop layer such that cap/etch stop layer 418 is not required. Further, separate cap and etch stop layers may be employed. For example, a cap layer may be needed for stability of the materials below it, but may not act as an etch stop layer. Therefore, a separate material may be employed, above the cap layer, as an etch stop. By way of example only, a cap/etch stop layer comprising Ru may allow oxygen to diffuse through, and alter the properties of, the underlying magnetic layers. In this instance, it may be desirable to additionally employ a layer comprising, e.g., TaN, below the Ru layer. According to this exemplary configuration, the layer comprising TaN would act as a cap layer, and the layer comprising Ru would act as an etch stop layer.

Suitable materials for forming cap/etch stop layer 418 include, but are not limited to Ru, Ta and TaN. Further, cap/etch stop layer 418 may have a thickness of up to about ten nm, for example, from about two nm to about ten nm. According to an exemplary embodiment, cap/etch stop layer 418 comprises Ru and is about ten nm thick.

Thin hard mask layer 420 is deposited on a side of cap/etch stop layer 418 opposite magnetic layer 416. Suitable materials for forming thin hard mask layer 420 include, but are not limited to, one or more of TaN, W, Ta, aluminum (Al) and Ru. Further, thin hard mask layer 420 may have a thickness of up to about 40 nm, for example, from about five nm to about 40 nm. According to an exemplary embodiment, thin hard mask layer 420 comprises TaN and is about 20 nm thick.

Thick hard mask layer 422 is deposited on a side of thin hard mask layer 420 opposite cap/etch stop layer 418. As will be described in steps 404 and 406, below, thin hard mask layer 420 and thick hard mask layer 422 comprise hard mask bilayer structure 423 and will be employed during formation of the magnetic tunnel junction. Suitable materials for forming thick hard mask layer 422 include, but are not limited to, one or more of titanium nitride (TiN), W, Al, Ta, TaN and silicon (Si). Further, thick hard mask layer 422 may have a thickness of up to about 40 nm, for example, from about five nm to about 40 nm. According to an exemplary embodiment, thick hard mask layer 422 comprises TiN and is about 20 nm thick.

As shown in step 402, hard mask bilayer structure 423, e.g., thin hard mask layer 420 and thick hard mask layer 422, are etched, e.g., using a dry etch process. The etching of thin hard mask layer 420 and thick hard mask layer 422 stops at the layer immediately beneath thin hard mask layer 420, e.g., cap/etch stop layer 418 in this embodiment. After this "hard mask open" step, hard mask bilayer structure 423 has a footprint that is approximately the desired size of the magnetic device. See, for example, step 406, described below.

In step 404, a gentle wet etch process is used to taper thick hard mask layer 422. Suitable wet etch processes include, but are not limited to, those comprising a hydrogen peroxide/ammonium hydroxide ($H_2O_2/NH_4OH$) wet etchant, e.g., for thick hard mask layer 422 comprising TiN, and an ammonium hydroxide ($NH_4OH$) wet etchant, e.g., for thick hard mask layer 422 comprising Al. During the tapering of thick hard mask layer 422, the thickness of thick hard mask layer 422 may decrease, e.g., by up to about 50 nm, as a result of the etching. For example, if thick hard mask layer 422 was originally about 150 nm thick, after wet etching it may be about 100 nm thick (at its thickest point). Unless there is residual masking of the top of thick hard mask layer 422, the thickness will decrease by approximately the same amount that the sidewalls are laterally recessed, as a consequence of the isotropy of the wet etching being used.

The wet etch process employed for tapering thick hard mask layer 422 should be selective for etching primarily thick hard mask layer 422. For example, in one embodiment, an $H_2O_2/NH_4OH$ wet etchant is employed to selectively etch thick hard mask layer 422 (comprising TiN) to the exclusion of thin hard mask layer 420 (comprising TaN) and cap/etch stop layer 418 (comprising Ru), which are substantially immune to etching by an $H_2O_2/NH_4OH$ wet etchant.

As shown in step 404 of FIG. 4, selectively etching thick hard mask layer 422 leaves behind a well-defined mask edge, determined by the juncture between thin hard mask layer 420 and cap/etch stop layer 418. The lateral dimensions of this juncture, e.g., as indicated by arrow 424, indicates approximately the desired final lateral dimensions of the magnetic device.

As described, for example, in conjunction with the description FIG. 3 above, hard mask bilayer structure 423 is configured to have a base, proximate to the material being etched, and a top opposite the base. The base has one or more lateral dimensions that are greater than one or more lateral dimensions of a top of hard mask bilayer structure 423, such that at least one portion of the base extends out laterally a substantial distance beyond the top. According to one exemplary embodiment, when viewed in lateral cross section, each portion of the base extending out laterally beyond the top has a longest lateral dimension that is between about 20 percent and about 40 percent of the longest lateral dimension of the base. For example, each portion of the base extending out laterally beyond the top may have a longest lateral dimension that is between about 30 percent and about 40 percent of the longest lateral dimension of the base.

The top of hard mask bilayer structure 423 is at a greater vertical distance from the material being etched than the base. For example, hard mask bilayer structure 423 may comprise a top, e.g., comprising thick hard mask layer 422, and a base, e.g., comprising thin hard mask layer 420. Hard mask bilayer structure 423 may be a circular, or substantially circular (e.g., elliptical) structure, wherein the base has a diameter that is greater than a diameter of the top of hard mask bilayer structure 423, distal to the material being etched. See, for example, FIGS. 7A-D. Specifically, according to one exemplary embodiment, hard mask bilayer structure 423 is circular, and has a diameter 424 at its base that is greater than diameter 426 at its top.

Further, each portion of the base extending out laterally beyond the top has a first slope associated with its upper surface, and at least one sidewall of the top has a second slope, the first slope being different from the second slope. Specifically, the slope of the sidewall of the top is greater than the slope of the upper surface of the base. According to the teachings presented herein, each of the first slope and the second slope, in any of the embodiments disclosed herein, may have a value of between zero and infinity. For example, as shown in step 404 of FIG. 4, the slope of the base is zero and the slope of the top is about 80 degrees near its uppermost surface.

In step 406, a dry etch process is used to etch cap/etch stop layer 418, magnetic layer 416, coupling layer 414, magnetic layer 412 and into or through barrier layer 410. Any suitable dry etch process that is compatible with using thin hard mask layer 420 for shape definition of the magnetic device may be employed. For example, when using a Ta or Ti-based thin hard mask layer 420, a highly-selective oxygen-based chemistry, such as $CO-NH_3$, may be employed, either alone or in combination with another etching technique, such as ion beam etching (IBE) (pure sputtering without a reactive component) or wet chemical etching. According to one exemplary embodiment, an oxygen-based etch is performed to etch through cap/etch stop layer 418 followed by IBE for the remainder.

Alternatively, IBE may be used exclusively throughout. If so, it may be desirable to increase the thickness of thin hard mask layer 420, e.g., to be up to about ten nm thicker than the total thickness of the layers being etched, so that it is not fully eroded during etching.

The above techniques will minimize, or prevent, re-distributed nonvolatile materials from being re-deposited on, and negatively affecting performance of, the magnetic layers in the device. For example, the above techniques reduce shadowing of incoming ions at the etch front, as defined by the regions not masked by thin hard mask layer 420, e.g., during IBE or RIE, because thick hard mask layer 422 is recessed away from the edge of the etch front. As a result, an increased sputter yield of material (e.g., material is sputtered-away), as compared to etching with conventional masking techniques, is experienced at regions of the device wherein re-deposition is most detrimental. Any nonvolatile material that is not sputtered away entirely from the wafer surface will be gettered near thick hard mask layer 422, e.g., and away from the sensitive etch front that exposes the edges of magnetic layers 408, 412, 414 and 416, and barrier layer 410. As such, the nonvolatile etch by-product (re-distributed material) will be kept away from the edges of magnetic layers 408, 412, 414 and 416, and barrier layer 410. Further, forward-sputtering of re-deposited materials back into the etch front is significantly reduced when compared with conventional etching techniques, because this forward-sputtering takes place at a distance from the etch front. Specifically, any material forward-sputtered from the edges of thick hard mask layer 422 will be deposited on the portions of thin hard mask layer 420 extending out beneath thick hard mask layer 422. The sensitive edges of layers 408, 410, 412, 414, and 416 can therefore be kept free of re-deposited material through the reduced forward-sputtering of etch by-products back into the sensitive region, and the increased sputter yield of material near the sensitive edges, because of reduced shadowing of incident etchant atoms, ions, or molecules.

The techniques described herein, e.g., using an isotropic wet etch to generate the desired hard mask profile, after a well-controlled vertical dry etch is used to define the final shape of the device, are scaling-friendly, i.e., can be used to create devices of various dimensions, including scaled-down versions of the devices presented herein. For example, according to the present techniques, geometric taper angle does not have to limit the scaling/minimum device dimensions, because the taper (slope) is shallow only over a small fraction of the total hard mask width, and a near-vertical sidewall is used to build up the bulk of the hard mask thickness for integration with associated wiring layers of the device.

Further, as mentioned above, the hard mask structure might comprise an electrically conductive material and can be used to form a contact to wiring levels. According to this embodiment, an isotropic wet etch may be used to pattern the hard mask structure. An isotropic wet etch serves to etch all faces of the hard mask structure at approximately the same rate. Therefore, a conductive hard mask structure, patterned according to the present techniques, using an isotropic wet etch, will comprise an electric contact centered, or substantially centered, on the device. Such a contact is referred to herein as a "self-aligned" contact, as it is formed during formation of the device. This embodiment allows for dense packing of devices, e.g., because it eliminates the complexity associated with having additional via levels for connection. The self-aligned conductive hard mask provides a straightforward way to connect wiring atop the device. See, for example, in FIG. 3, described above, wherein wiring layer 330 contacts conductive thick hard mask layer 318 without risking wiring layer 330 inadvertently contacting layers beneath the tunnel barrier and shunting the device. Thick hard mask layers, such as thick hard mask layers 318 and 422, are generally easier to integrate with ensuing wiring levels because there is less of a danger of these wiring layers contacting the layers beneath barrier layer 314. There are, however, limits on the thickness of the hard mask layers. For example, if the thick hard mask layer negatively affects the etch through the aforementioned shadowing and forward-sputtering processes, and thus results in loss of performance, it may be too thick. For example, in MTJ devices wherein wiring layers similar to wiring layer 330 are used to generate a magnetic field to switch the device, the power required to switch the device will increase as wiring layer 330 is moved away from the active magnetic layers. At the same time, while a thin hard mask structure (e.g., hard mask bilayer structure 423 with thin, or nonexistent thick hard mask layer 422) can solve problems with etch re-deposition, it can be difficult to integrate with ensuing wiring layers because it does not provide a means for self-aligned contacting. The hard mask structures presented herein merge the benefits of a thick hard mask layer with the benefits of a thin hard mask layer to provide an exemplary means of contacting ensuing wire layers, while at the same time providing a means of defining structures during etch.

FIG. 5 is a diagram illustrating another exemplary methodology for forming a magnetic device. The formation of the magnetic device shown in FIG. 5 comprises etching of nonvolatile materials. According to one exemplary embodiment, the magnetic device formed comprises an MTJ. In step 502, the layers used to form the magnetic device are provided. Specifically, magnetic layer 506 will serve as a reference layer for the magnetic device. Suitable materials for forming magnetic layer 506 include, but are not limited to, those described in conjunction with the description of magnetic layer 408 above. Magnetic layer 506 may comprise a single layer, or alternatively, multiple layers.

Barrier layer 508, deposited on a top side of magnetic layer 506, will serve as a tunnel barrier for the magnetic device. Suitable materials for forming barrier layer 508 include, but are not limited to, those described in conjunction with the description of barrier layer 410 above.

Magnetic layer 510, deposited on a side of barrier layer 508 opposite magnetic layer 506, will serve as a bottom storage layer, e.g., of a multi-storage layer configuration, for the magnetic device. Suitable materials for forming magnetic layer 510 include, but are not limited to, those described in conjunction with the description of magnetic layer 412 above.

Coupling layer 512, deposited on a side of magnetic layer 510 opposite barrier layer 508, will serve as a coupling layer for magnetic layer 510 and magnetic layer 514 (described below), e.g., for a multi-layer storage layer configuration. Suitable materials for forming coupling layer 512 include, but are not limited to, those described in conjunction with the description of coupling layer 414 above.

Magnetic layer 514, deposited on a side of coupling layer 512 opposite magnetic layer 510, will serve as a top storage layer, e.g., of a multi-layer storage layer configuration, for the magnetic device. Suitable materials for forming magnetic layer 514 include, but are not limited to, those described in conjunction with the description of magnetic layer 416 above.

Cap/etch stop layer 516 is deposited on a side of magnetic layer 514 opposite coupling layer 512. Suitable materials for forming cap/etch stop layer 516 include, but are not limited to, those described in conjunction with the description of cap/etch stop layer 418 above. Further, cap/etch stop layer 516 may have a thickness of up to about 20 nm, for example, from about two nm to about 20 nm. According to an exemplary embodiment, cap/etch stop layer 516 comprises Ru and is about ten nm thick.

Hard mask layer 518 is deposited on a side of cap/etch stop layer 516 opposite magnetic layer 514. As will be described in step 504, below, hard mask layer 518 will be employed, e.g., as a hard mask structure, during formation of the magnetic device. Suitable materials for forming hard mask layer 518 include, but are not limited to, those described in conjunction with the description of thick hard mask layer 422 above. Further, hard mask layer 518 may have a thickness of up to about 200 nm, for example, from about 70 nm to about 200 nm. According to an exemplary embodiment, hard mask layer 518 comprises TiN and is about 200 nm thick. Therefore, according to the exemplary embodiment shown in FIG. 5, the hard mask structure comprises a single layer, hard mask layer 518.

In step 504, etching is used to taper thick hard mask layer 518. According to one exemplary embodiment, wet etching techniques are employed to etch hard mask layer 518.

As described, for example, in conjunction with the description of FIGS. 3 and 4 above, the hard mask structure is configured to have a base, proximate to the material being etched, that has one or more lateral dimensions that are greater than one or more lateral dimensions of a top of the hard mask structure, such that at least one portion of the base extends out laterally a substantial distance beyond the top. According to one exemplary embodiment, when viewed in lateral cross section, each portion of the base extending out laterally beyond the top has a longest lateral dimension that is between about 20 percent and about 40 percent of the longest lateral dimension of the base. For example, each portion of the base extending out laterally beyond the top may have a longest lateral dimension that is between about 30 percent and about 40 percent of the longest lateral dimension of the base.

The top of the hard mask structure is at a greater vertical distance from the material being etched than the base. For example, according to one exemplary embodiment, the base is defined as a portion of the hard mask structure extending up to about ten nm horizontally inward from the material being etched. The top is thus any portion of the hard mask structure extending beyond up to about ten nm horizontally inward from the material being etched. By way of example only, in step 504 of FIG. 5, the base and the top may be distinguished by line 524 which begins above the portion of the hard mask structure extending up to about ten nm horizontally inward from the material being etched.

The hard mask structure may comprise a circular, or substantially circular (e.g., elliptical) structure, wherein the base has a diameter that is greater than a diameter of the top of the hard mask structure, distal to the material being etched. See, for example, FIGS. 7A-D. Specifically, according to one exemplary embodiment, the hard mask structure is circular, and has a diameter 520 at its base that is greater than diameter 522 at its top. Further, each portion of the base extending out laterally beyond the top has a first slope associated with its uppermost surface, and at least one sidewall of the top has a second slope, the first slope being different from the second slope. Specifically, the slope of the top is greater than the slope of the base.

Additionally, the hard mask structure may comprise other materials in combination with hard mask layer 518, including, but not limited to, dielectric masks, removable mandrels, and combinations comprising at least one of the foregoing additional materials. When a dielectric mask is used, it may optionally be coated with a metallic spacer material. Coating the dielectric mask with a metallic spacer material provides for contact with wiring levels above the hard mask structure, e.g., as in the embodiment wherein the hard mask is conductive.

Removable mandrel techniques comprise the use of a disposable hard mask. Specifically, after etching of the device layers, the device and the hard mask structure are encapsulated in a dielectric. If not already exposed, the hard mask is then exposed by an etchback or polish step. Next, the hard mask structure is selectively removed, e.g., like a mandrel, and the newly formed cavity is filled with a conductive material that provides contact between the device and, e.g., a wiring level above the device. This approach provides for a self-aligned contact even though a conductive hard mask is not used, and at the same time utilizes the present mask structure to etch nonvolatile materials.

According to an exemplary embodiment, dry etch (instead of wet etch) chemistries are used to etch hard mask layer 518. It is desired that the dry etch employed has a high level of isotropy, e.g., produces an etch profile that is substantially uniform in all directions resulting in a profile wherein the hard mask structure is taller at its center than at its edges (and in the case of a self-aligned contact, as described above, the hard mask structure is substantially taller in the center of the device than at the device edges). Although typically a natural result of most wet etches, the achievement of isotropy with a dry etch requires care to use low bias power in conjunction with a chemical etch component. This is not particularly difficult for hard mask materials that can be etched using standard RIE (volatile byproduct) techniques. Chlorine (Cl), bromine (Br) or fluorine (F) can be used to etch hard mask materials like Ta, Ti, Al, W, Si and compounds created therefrom.

The use of isotropic etch techniques results in the desired hard mask shape, as described above, for the purpose of reducing shadowing of the etch front, and in aiding further process integration to contact the above wiring layer. After the hard mask etch, the etch used to pattern the magnetic layers should be highly selective against etching the hard mask material, as the hard mask structure thins towards the edges of the device (see step 504). For example, a CO—$NH_3$ or methanol etch could be used in conjunction with a Ta or Ti-based hard mask structure to achieve such selectivity. Although the embodiment presented in FIG. 5 is less complicated that that of FIG. 4, the process as outlined in FIG. 4 affords more control over device shape and size, and is thus preferable for most applications wherein shape or size are important.

Further according to this exemplary embodiment, a layer comprising a material having an etch rate (in the hard mask etch process) that is lower than hard mask layer 518, e.g., an intermediate hard mask layer (not shown), may be employed between hard mask layer 518 and cap/etch stop layer 516. Suitable materials for forming an intermediate hard mask layer include, but are not limited to Ta, TaN, Ti, TiN, Si, Al, W, Cr, Mo and combinations comprising at least one of the foregoing materials. Employing such a layer serves to increase the thickness of the hard mask near the edges, e.g., in a manner similar to that described in FIG. 4, but without an explicit step to recess hard mask layer 518 after the intermediate mask layer has been etched.

Figure 6A:
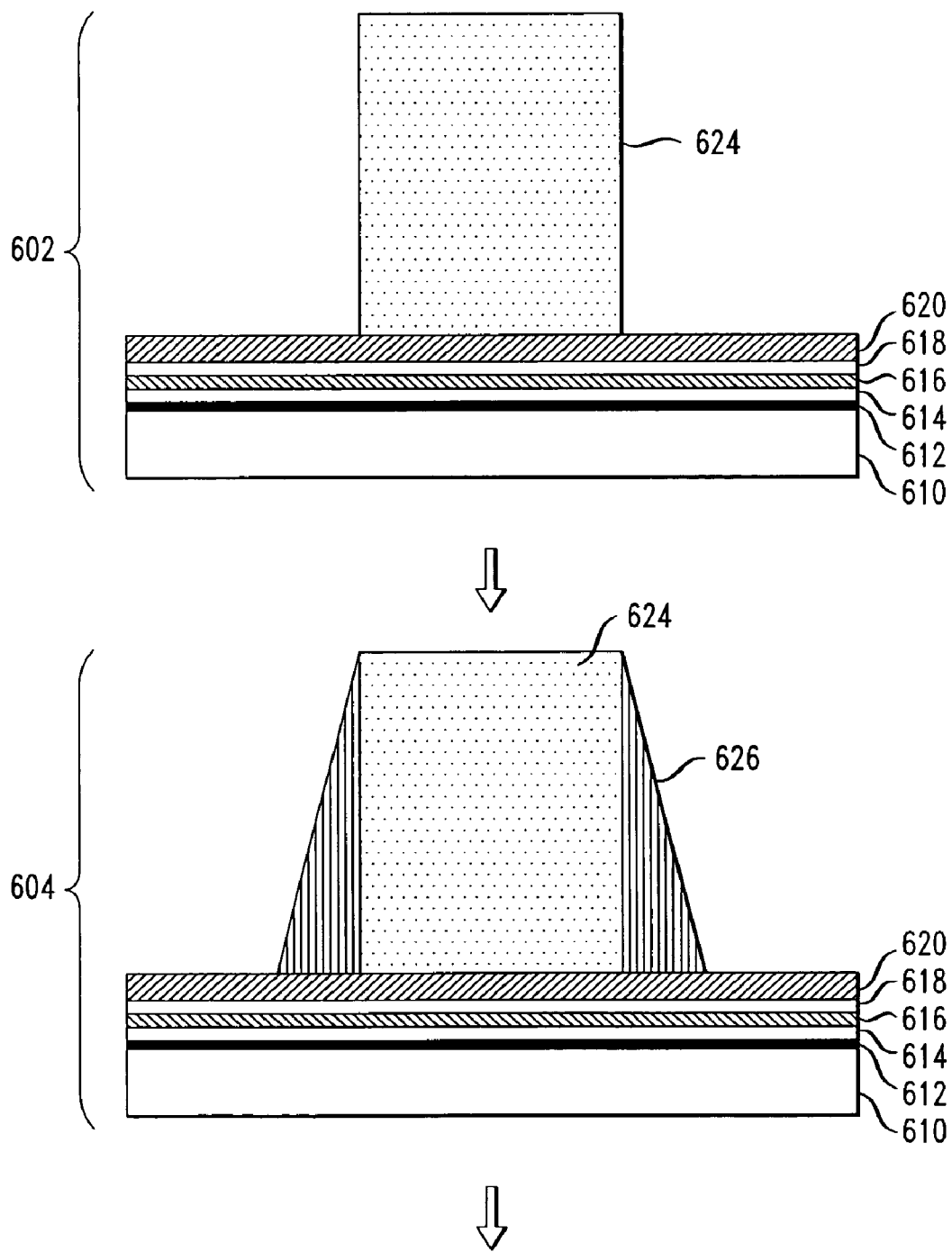
FIGS. 6A-B are diagrams illustrating yet another exemplary methodology for forming a magnetic device according to an embodiment of the present invention.
Figure 6B:
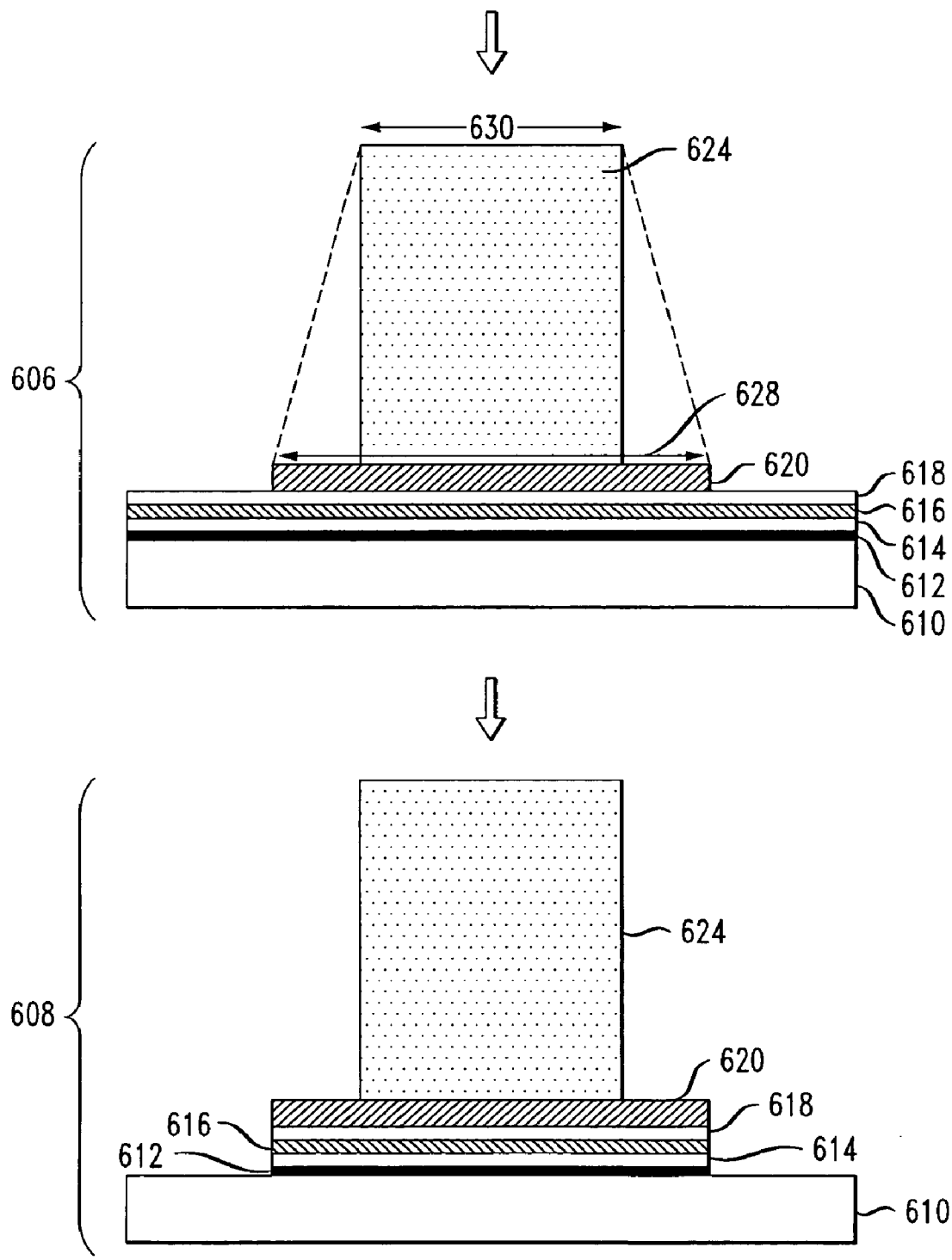

FIGS. 6A-B are diagrams illustrating yet another exemplary methodology for forming a magnetic device. According to one exemplary embodiment, the magnetic device formed comprises an MTJ. In step 602, the layers used to form the magnetic device are provided. Specifically, magnetic layer 610 will serve as a reference layer for the magnetic device. Suitable materials for forming magnetic layer 610 include, but are not limited to, those described in conjunction with the description of magnetic layers 408 and 506 above. Magnetic layer 610 may comprise a single layer, or alternatively, multiple layers.

Barrier layer 612, deposited on a top side of magnetic layer 610, will serve as a tunnel barrier for the magnetic device. Suitable materials for forming barrier layer 612 include, but are not limited to, those described in conjunction with the description of barrier layers 410 and 508 above.

Magnetic layer 614, deposited on a side of barrier layer 612 opposite magnetic layer 610, will serve as a bottom storage layer, e.g., of a multi-layer storage layer configuration, for the magnetic device. Suitable materials for forming magnetic layer 614 include, but are not limited to, those described in conjunction with the description of magnetic layers 412 and 510 above.

Coupling layer 616, deposited on a side of magnetic layer 614 opposite barrier layer 612, will serve as a coupling layer for magnetic layer 614 and magnetic layer 618 (described below), e.g., for a multi-layer storage layer configuration. Suitable materials for forming coupling layer 616 include, but are not limited to, those described in conjunction with the description of coupling layers 414 and 512, above.

Magnetic layer 618, deposited on a side of coupling layer 616 opposite magnetic layer 614, will serve as a top storage layer, e.g., of a multi-layer storage layer configuration, for the magnetic device. Suitable materials for forming magnetic layer 618 include, but are not limited to, those described in conjunction with the description of magnetic layers 416 and 514, above.

A combined cap/etch stop/thin hard mask layer 620 is deposited on a side of magnetic layer 618 opposite coupling layer 616. Suitable materials for forming cap/etch stop/thin hard mask layer 620 include, but are not limited to Ru, Ta and TaN and bilayers comprising one or more of the foregoing. Further, cap/etch stop/thin hard mask layer 620 may have a thickness of up to about 20 nm, for example, from about two to about 20 nm. According to an exemplary embodiment, cap/etch stop/thin hard mask layer 620 comprises TaN and is about ten nm thick.

Hard mask layer 624 is deposited on a side of cap/etch stop/thin hard mask layer 620 opposite magnetic layer 618. Suitable materials for forming hard mask layer 624 include, but are not limited to, one or more of TiN, W, Al, Ta, TaN and Si. Further, hard mask layer 624 may have a thickness of up to about 200 nm, for example, from about 50 nm to about 200 nm. According to an exemplary embodiment, hard mask layer 624 comprises TiN and is about 100 nm thick.

As shown in step 602, hard mask layer 624 is etched. Specifically, hard mask layer 624 may be etched down to cap/etch stop/thin hard mask layer 620, e.g., using a standard anisotropic RIE that creates near-vertical sidewalls.

In step 604, the edges of the etched hard mask layer 624 are coated with spacer material 626. The shape of spacer material 626 is obtained using standard techniques that include conformal film deposition and anisotropic etch that preferentially removes spacer material 626 from all horizontal surfaces. Suitable spacer materials include, but are not limited to, one or more of organic polymers, dielectrics and metals. According to the exemplary embodiment shown in step 604, spacer material 626, at its base, has a width of between about ten nm and about 50 nm.

In step 606, the final hard mask structure is formed when cap/etch stop/thin hard mask layer 620 is etched and then spacer material 626 is removed, e.g., with a dry or wet etch that is selective against etching hard mask 624 and cap/etch stop/thin hard mask layer 620. Thus, according to the exemplary embodiment shown in FIG. 6, the hard mask structure comprises hard mask layer 624 and cap/etch stop/thin hard mask layer 620.

As described, for example, in conjunction with the description of FIGS. 3-5 above, the hard mask structure is configured to have a base, proximate to the material being etched, that has one or more lateral dimensions that are greater than a top of the hard mask structure, such that at least one portion of the base extends out laterally a substantial distance beyond the top. According to one exemplary embodiment, when viewed in lateral cross section, each portion of the base extending out laterally beyond the top has a longest lateral dimension that is between about 20 percent and about 40 percent of the longest lateral dimension of the base. For example, each portion of the base extending out laterally beyond the top may have a longest lateral dimension that is between about 30 percent and about 40 percent of the longest lateral dimension of the base.

The top of the hard mask structure is at a greater distance from the material being etched than the base. For example, the hard mask structure may comprise a base, e.g., comprising cap/etch stop/thin hard mask layer 620, and a top, e.g., comprising hard mask layer 624. The hard mask structure may be a circular, or substantially circular (e.g., elliptical) structure, wherein the base has a diameter that is greater than a diameter of the top of the hard mask structure, distal to the material being etched. See, for example, FIGS. 7A-D. Specifically, according to one exemplary embodiment, the hard mask structure is circular, and has a diameter 628 at its base that is greater than diameter 630 at its top. Further, each portion of the base extending out laterally beyond the top has a first slope associated with its uppermost surface and at least one sidewall of the top has a second slope, the first slope being different from the second slope. Specifically, the slope of the top is greater than the slope of the base. For example, the slope of the base and of the top, as shown in step 606 of FIG. 6b, is zero and infinity (90 degrees), respectively.

In step 608, magnetic layer 614, coupling layer 616 and magnetic layer 618 are etched, e.g., to dimensions similar to cap/etch stop/thin hard mask layer 620, using an etch technique that is selective against etching cap/etch stop/thin hard mask layer 620. In an alternative embodiment, spacer material 626 would remain until after the magnetic layers are etched. A liftoff would then be performed to remove spacer material 626 along with any residual nonvolatile materials that may have accumulated on its surface during the etch of the magnetic materials.

EXAMPLES

Figure 7A:
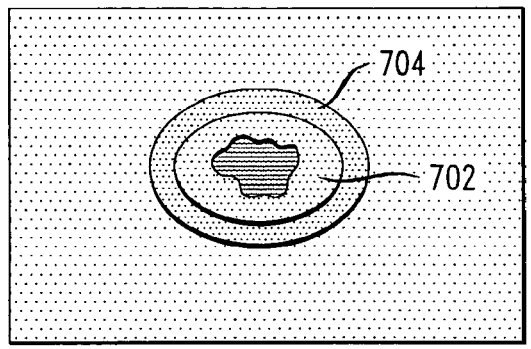
FIGS. 7A-D are images illustrating hard mask structures graded using the present techniques according to an embodiment of the present invention.
Figure 7B:
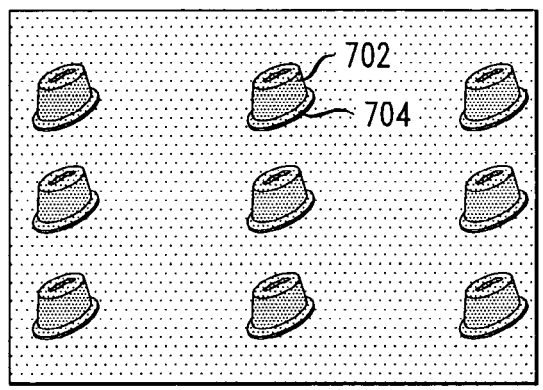
Figure 7C:
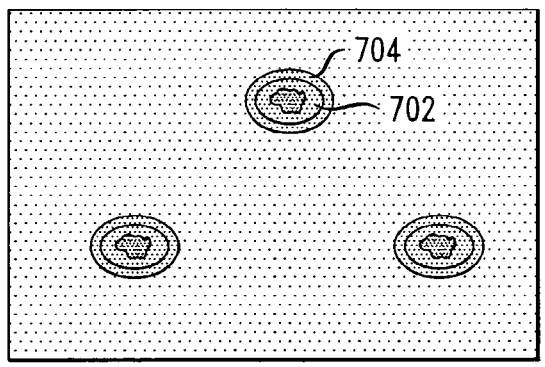
Figure 7D:
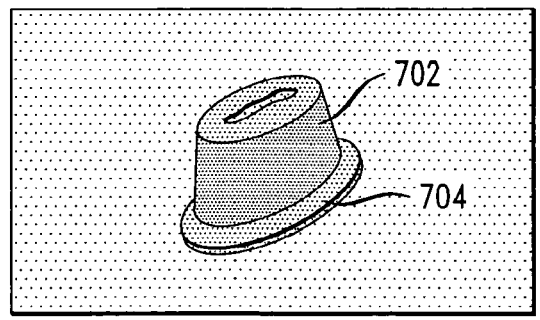

FIGS. 7A-D are images of hard mask structures graded using the present techniques. Specifically, FIGS. 7A and 7C show top-down views and FIGS. 7B and 7D show tilted-angle side views of graded hard mask structures.

Each of the hard mask structures shown in FIGS. 7A-D comprise a thick hard mask layer on top of a thin hard mask layer, e.g., hard mask layers 702 and 704, respectively. Hard mask layer 702, the thick hard mask layer, comprises TiN. Hard mask layer 704, the thin hard mask layer, comprises TaN. Hard mask layer 704 extends out as a foot beneath hard mask layer 702. The structures were formed in the manner described in FIG. 4, above, e.g., with a chlorine-based RIE to pattern the hard mask layers 702 and 704, and a $H_2O_2$/$NH_4OH$ wet etch to recess the TiN behind the foot of TaN.

As described, for example, in conjunction with the description of FIGS. 3-6 above, the hard mask structure may comprise a circular, or substantially circular (e.g., elliptical), structure, wherein the base has a diameter that is greater than a diameter of the top of the hard mask structure, distal to the material being etched. For example, as shown in FIGS. 7A-D, hard mask layer 704 has a diameter that is greater than hard mask layer 702.

Figure 8A:
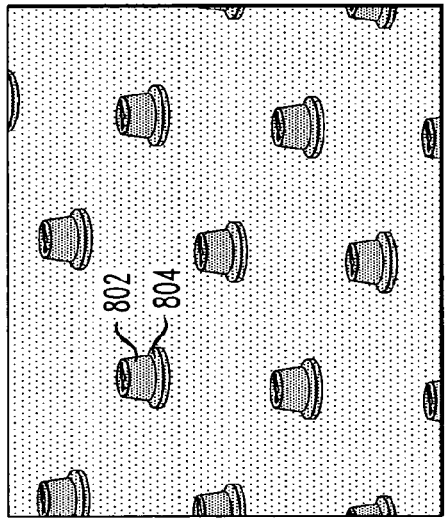
FIGS. 8A-D are images of hard mask structures graded using the present techniques after etching of underlying nonvolatile materials according to an embodiment of the present invention.
Figure 8B:
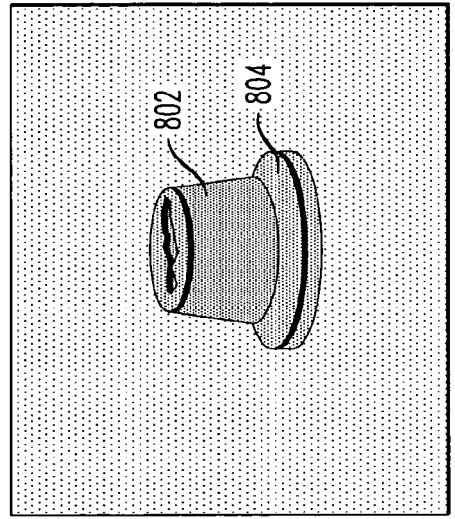
Figure 8C:
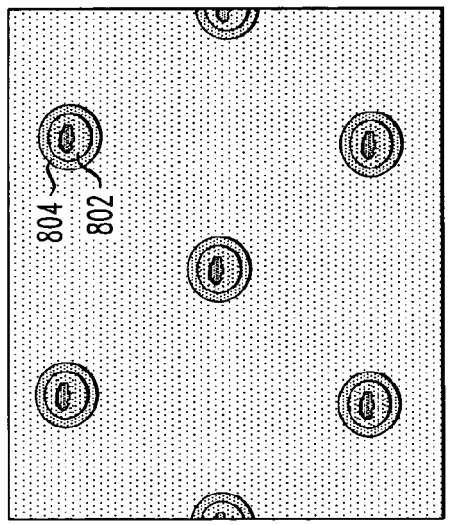
Figure 8D:
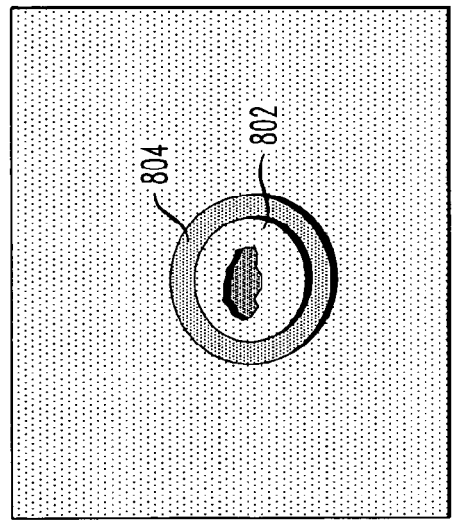

FIGS. 8A-D are also images of hard mask structures graded using the present techniques. The images in FIGS. 8A-D reveal the magnetic layers, e.g., of a magnetic device, after etching has been conducted using the graded hard mask structure. Specifically, FIGS. 8A and 8C show top-down views and FIGS. 8B and 8D show tilted-angle side views of fully-etched magnetic devices with graded hard mask structures. As described in conjunction with the description of FIGS. 7A-D, above, each of the hard mask structures shown in FIGS. 8A-D comprise a thick hard mask layer on top of a thin hard mask layer, e.g., hard mask layers 802 and 804, respectively. Hard mask layer 802, the thick hard mask layer, comprises TiN. Hard mask layer 804, the thin hard mask layer, comprises TaN. Hard mask layer 804 extends out as a foot beneath hard mask layer 802.

Reactive ion etching with a $CO-NH_3$ plasma has been used to etch magnetic layers existing below hard mask layer 804. As shown, hard mask layer 804 provided a robust mask against the etch.

In conclusion, the techniques presented herein serve to, at least in part, prevent unfavorable magnetic device characteristics resulting from nonvolatile material re-deposited during formation of the device.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method of patterning at least one material, the method comprising the steps of:

forming a multilayered hard mask structure on at least one surface of the material to be patterned, each of the layers of the hard mask structure being electrically conductive, the hard mask structure being configured to have at least a first layer having one or more lateral dimensions that are greater than one or more lateral dimensions of at least a second layer of the hard mask structure, such that at least one portion of the first layer extends out laterally a substantial distance beyond the second layer, the second layer of the hard mask structure being at a greater vertical distance from the material being etched than the first layer, and the second layer having one or more vertical dimensions that are greater than one or more vertical dimensions of the first layer; and etching the material.

2. The method of claim 1, wherein the at least one portion of the first layer extending out laterally beyond the second layer has a first slope associated with an uppermost surface thereof and at least one sidewall of the second layer has a second slope, the first slope being less than the second slope.

3. The method of claim 1, wherein each at least one portion of the first layer extending out laterally beyond the second layer, when viewed in lateral cross section, has a longest lateral dimension that is between about 20 percent and about 40 percent of the longest lateral dimension of the first layer.

4. The method of claim 1, wherein each at least one portion of the first layer extending out laterally beyond the second layer, when viewed in lateral cross section, has a longest lateral dimension that is between about 30 percent and about 40 percent of the longest lateral dimension of the first layer.

5. The method of claim 1, wherein the material being etched comprises at least one nonvolatile material.

6. The method of claim 1, further comprising the step of reducing one or more lateral dimensions of the second layer of the hard mask structure.

7. The method of claim 1, further comprising the step of reducing one or more lateral dimensions of the second layer of the hard mask structure by etching.

8. The method of claim 1, farther comprising the step of reducing one or more lateral dimensions of the second layer of the hard mask structure by use of one or more of selective wet etching and selective reactive ion etching techniques.

9. The method of claim 1, farther comprising the step of utilizing one or more disposable spacer materials to achieve the at least one portion of the first layer extending out laterally a substantial distance beyond the second layer.

10. The method of claim 9, wherein the one or more disposable spacer materials comprise one or more of organic polymers, dielectric materials, and metals.

11. The method of claim 1, wherein etching of the material comprises use of one or more of reactive ion etching and ion beam etching.

12. The method of claim 1, wherein the material comprises one or more layers of a magnetic device.

13. A method of forming a device comprising at least one nonvolatile material, the method comprising the steps of:

forming a multilayered hard mask structure on at least one surface of the material to be patterned, each of the layers of the hard mask structure being electrically conductive, the hard mask structure being configured to have at least a first layer having one or more lateral dimensions that are greater than one or more lateral dimensions of at least a second layer of the hard mask structure, such that at least one portion of the first layer extends out laterally a substantial distance beyond the second layer, the second layer of the hard mask structure being at a greater vertical distance from the material being etched than the first layer, and the second layer having one or more vertical dimensions that are greater than one or more vertical dimensions of the first layer; and etching the material.

14. The method of claim 13, wherein the device comprises a magnetic device.

15. The method of claim 14, wherein the nonvolatile material comprises one or more magnetic layers.

16. The method of claim 13, wherein the device comprises one or more of ferroelectric random access memory devices, phase change memory devices, and complementary metal oxide semiconductor devices.

17. The method of claim 1, wherein the multilayered hard mask structure comprises at least one hard mask component with a tapered configuration.

18. The method of claim 1, wherein the multilayered hard mask structure is formed comprising a pair of hard mask layers.

19. The method of claim 18, further comprising the step of forming the pair of hard mask layers such that one of the hard mask layers has a cross-sectional thickness greater than a cross-sectional thickness of another of the hard mask layers.

20. The method of claim 18, wherein one of the hard mask layers comprises TiN and another of the hard mask layers comprises TaN.

21. The method of claim 1, further comprising the step of forming one or more wiring connections using the multilayered hard mask structure.

22. The method of claim 21, further comprising the step of forming one or more magnetic tunnel junctions using the one or more wiring connections.

23. The method of claim 13, further comprising the step of forming one or more wiring connections using the multilayered hard mask structure.

24. The method of claim 23, further comprising the step of forming one or more magnetic tunnel junctions using the one or more wiring connections.

* * * * *